US012805331B2

(12) United States Patent
Lee et al.

(10) Patent No.: US 12,805,331 B2
(45) Date of Patent: Nov. 17, 2026

(54) PARTIALLY SHIELDED SEMICONDUCTOR DEVICE AND METHOD FOR MAKING THE SAME

(71) Applicant: STATS ChipPAC Pte. Ltd., Singapore (SG)

(72) Inventors: HunTeak Lee, Gyeongi-do (KR); SangHo Song, Incheon (KR); YeonJee Lee, Gyeonggi-do (KR); HeeSoo Lee, Incheon (KR)

( * ) Notice: Subject to any disclaimer, the term of this patent is extended or adjusted under 35 U.S.C. 154(b) by 636 days.

(21) Appl. No.: 18/332,779

(22) Filed: Jun. 12, 2023

(65) Prior Publication Data

US 2023/0402400 A1 Dec. 14, 2023

(30) Foreign Application Priority Data

Jun. 14, 2022 (CN) ......................... 202210672111.1

(51) Int. Cl.
*H01L 23/552* (2006.01)
*H10W 42/20* (2026.01)
*H10W 74/01* (2026.01)

(52) U.S. Cl.
CPC ........... *H10W 42/20* (2026.01); *H10W 74/01* (2026.01)

(58) Field of Classification Search
None
See application file for complete search history.

(56) References Cited

U.S. PATENT DOCUMENTS 7,799,602 B2 9/2010 Pagaila et al.
7,989,928 B2 * 8/2011 Liao ........................ H10P 72/74 29/841
9,070,793 B2 6/2015 Liao et al.
10,418,332 B2 * 9/2019 Lee ....................... H10W 42/20
(Continued)

FOREIGN PATENT DOCUMENTS

CN 109727931 A 5/2019
CN 110349937 A 5/2022
(Continued)

OTHER PUBLICATIONS

The Search Report for the counterpart Chinese patent application 202210672111.1, mailed on Jul. 29, 2026.
(Continued)

*Primary Examiner* — Long Pham
(74) *Attorney, Agent, or Firm* — Junhe Law Office P.C.; Yi Zhang

(57) ABSTRACT

A method for making a semiconductor device comprises: providing a substrate having a first region and a second region, wherein the first region comprises at least one electronic component and a conductive pattern formed therein; forming a conductive bar on the conductive pattern; forming an encapsulant layer in the first region of the substrate to cover the at least one electronic component, the conductive bar and the conductive pattern; removing a portion of the encapsulant layer that is above the conductive bar to expose the conductive bar and separate the encapsulant layer into a main portion and a peripheral portion; disposing a deposition mask above the substrate to cover the second region; and depositing a conductive material on the substrate to form a shielding layer on the substrate which is not covered by the deposition mask.

15 Claims, 12 Drawing Sheets

(56) References Cited

U.S. PATENT DOCUMENTS

| | | | | |
|---|---|---|---|---|
| 10,510,733 | B2 | 12/2019 | Kumar et al. | |
| 10,937,741 | B2 * | 3/2021 | Yang | H10P 72/74 |
| 11,756,894 | B2 * | 9/2023 | Han | H01Q 1/2283 257/428 |
| 12,431,457 | B2 * | 9/2025 | Lear | H05K 1/0218 |
| 2010/0140759 | A1 | 6/2010 | Pagaila et al. | |
| 2016/0276307 | A1 | 9/2016 | Lin | |
| 2020/0105715 | A1 * | 4/2020 | Jang | H10P 72/7402 |
| 2020/0194379 | A1 | 6/2020 | Kim et al. | |
| 2020/0286839 | A1 | 9/2020 | Jang | |
| 2021/0091017 | A1 | 3/2021 | Yeon et al. | |
| 2021/0151386 | A1 * | 5/2021 | Yang | H10P 72/74 |
| 2022/0157739 | A1 | 5/2022 | Lee et al. | |
| 2023/0215812 | A1 * | 7/2023 | Jung | H10P 54/00 257/659 |
| 2024/0203896 | A1 * | 6/2024 | Wu | H10W 42/20 |
| 2025/0309135 | A1 * | 10/2025 | Zhang | H10W 42/20 |

FOREIGN PATENT DOCUMENTS

| | | | |
|---|---|---|---|
| CN | 111383925 | A | 5/2022 |
| CN | 113889460 | A | 5/2022 |
| CN | 114512408 | A | 5/2022 |
| KR | 10-2020-0107201 | A | 9/2020 |
| TW | 202221884 | A | 6/2022 |

OTHER PUBLICATIONS

The Office Action for the counterpart Korean patent application 10-2023-0067584, mailed on Jul. 9, 2026.

* cited by examiner

PARTIALLY SHIELDED SEMICONDUCTOR DEVICE AND METHOD FOR MAKING THE SAME

TECHNICAL FIELD

The present application generally relates to semiconductor technology, and more particularly, to a partially shielded semiconductor device and a method for making a semiconductor device.

BACKGROUND OF THE INVENTION

For electronic components in an electronic product, electromagnetic interference (EMI) shielding needs to be implemented to prevent disruption by electromagnetic field, electrostatic field, etc. Furthermore, the EMI shielding for electronic components is generally required to be grounded via a contact pad outside the EMI shielding. However, such external contact pad increases a distance from the shielded electronic components to other non-shielded electronic components on the same substrate such as a printed circuit board, which impedes the further improvement on the integration of semiconductor packages.

Therefore, a need exists for an improved method for making semiconductor devices with shielding layers.

SUMMARY OF THE INVENTION

An objective of the present application is to provide a partially shielded semiconductor device and a method for making such semiconductor device.

According to an aspect of the present application, a method for making a semiconductor device is provided. The method comprises: providing a substrate having a first region and a second region, wherein the first region comprises at least one electronic component and a conductive pattern formed therein; forming a conductive bar on the conductive pattern; forming an encapsulant layer in the first region of the substrate to cover the at least one electronic component, the conductive bar and the conductive pattern; removing a portion of the encapsulant layer that is above the conductive bar to expose the conductive bar and separate the encapsulant layer into a main portion and a peripheral portion, wherein the peripheral portion is adjacent to the second region of the substrate relative to the main portion; disposing a deposition mask above the substrate to cover the second region; and depositing a conductive material on the substrate to form a shielding layer on the substrate which is not covered by the deposition mask.

According to another aspect of the present application, a partially shielded semiconductor device is provided. The partially shielded semiconductor device comprises: a substrate having a first region and a second region adjacent to the first region, wherein a first electronic component is disposed within the first region and a second electronic component is disposed within the second region; an encapsulant layer formed on the substrate and covering the first electronic component; a shielding layer formed on the encapsulant layer in the first region but not in the second region; a conductive pattern formed on the substrate and within the encapsulant layer; and a conductive bar formed within the encapsulant layer and exposed from the encapsulant layer, wherein at least a portion of the conductive bar is shielded by and connected with the shielding layer to electrically coupling the shielding layer with the conductive pattern on the substrate.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

Figure 1A:
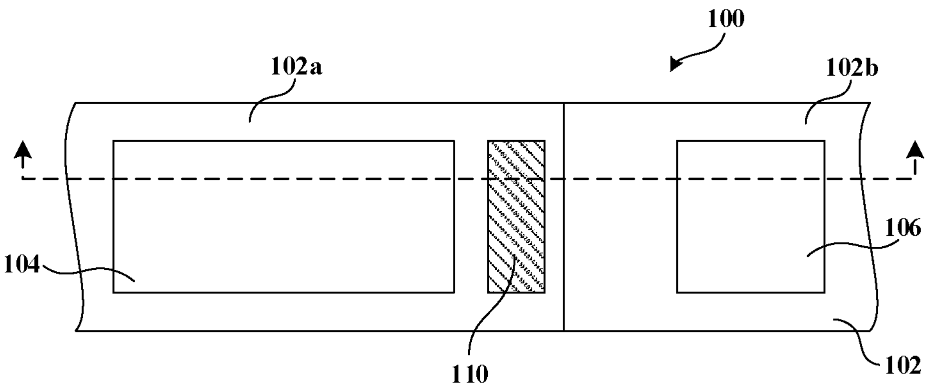
FIGS. 1A and 1B illustrate a semiconductor device according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as “beneath”, “below”, “above”, “over”, “on”, “upper”, “lower”, “left”, “right”, “vertical”, “horizontal”, “side” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being “connected to” or “coupled to” another element, it may be directly connected to or coupled to the other element, or intervening elements may be present.

The inventors of the present application found that contact pads on a substrate outside of an EMI shielding for electronic components may increase a distance from the shielded electronic components to other non-shielded electronic components on the same substrate, which is not desired. In order to resolve the problem, the inventors conceived a new semiconductor package design, which replaces the conventional external contact pads with internal contact pads formed within an encapsulation layer covered by the EMI shielding. In this way, the distance between the shielded electronic components to the non-shielded electronic components can be reduced.

Figure 1B:
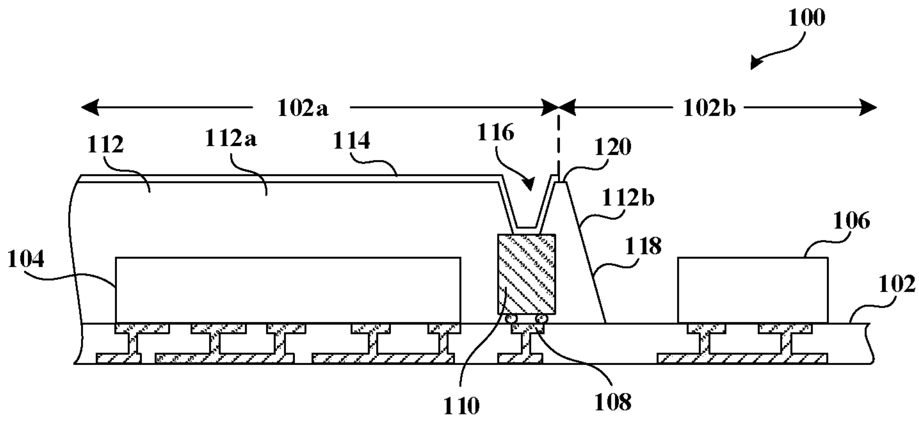

FIGS. 1A and 1B illustrate a semiconductor device 100 according to an embodiment of the present application. FIG. 1A is a top view of the semiconductor device 100, and FIG. 1B is a cross-sectional view of the semiconductor device 100 along a section line AA shown in FIG. 1A.

As shown in FIGS. 1A and 1B, the semiconductor device 100 includes a substrate 102. The substrate 102 can be a printed circuit board or another suitable substrate that can support and interconnect various electronic components. In some embodiments, the substrate 102 may include one or more insulating or passivation layers and one or more interconnection structures formed in the insulating or passivation layers. The substrate 102 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The substrate 102 can also be a multi-layer flexible laminate, ceramic, copper clad laminate, or glass.

The substrate 102 includes a first region 102*a* and a second region 102*b* adjacent to the first region 102*a*. At least one electronic component 104 is disposed in the first region 102*a*. In some embodiments, the electronic component 104 may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc.; however, the electronic component 104 may also include discrete components such as resistors, capacitors, inductors, etc. Some other electronic component(s) 106 are disposed in the second region 102*b*. The electronic component 104 and the electronic component 106 may have different requirements on EMI shielding, due to their respective functions in the semiconductor device 100. In some embodiments, the electronic component 106 may include board-to-board connectors, antennas or other components that do not require EMI shielding.

A conductive pattern 108 is also formed within the first region 102*a* of the substrate 102. The conductive pattern 108 can be connected to the interconnection structure in the substrate 102. When the semiconductor device 100 is assembled with other electronic devices in an electronic product or an electronic system, the conductive pattern 108 can be electrically coupled to the ground or other voltage reference to serve as a reference for the semiconductor device 100. In the embodiment shown in FIGS. 1A and 1B, the conductive pattern 108 is disposed between the electronic component 104 and the electronic component 106. However, in some other embodiments, the conductive pattern 108 may not be disposed between the electronic component 104 and the electronic component 106. For example, the conductive pattern 108 may be disposed away from the electronic component 106 relative to the electronic component 104.

An encapsulant layer 112 is formed on the substrate 102 to cover the electronic component 104. In some embodiments, the encapsulant layer 112 may be made of a polymer composite material such as epoxy resin with filler, epoxy acrylate with filler, or polymer with proper filler, for example. Furthermore, a shielding layer 114 is formed on the encapsulant layer 112 in the first region 102*a* to shield EMI induced to or generated by the electronic component 104. In some embodiments, the shielding layer 114 can be made of a conductive material such as copper, aluminum, iron, or any other suitable material for electromagnetic interference (EMI) shielding. In the embodiment, the shielding layer 114 does not extend to the second region 102*b*, that is, an edge of the shielding layer 114 is at a boundary between the first region 102*a* and the second region 102*b*.

Since the shielding layer 114 is formed topmost of the semiconductor device 100, while the conductive pattern 108 is formed on the top surface of the substrate 102 which is nearly lowermost of the semiconductor device 100, one or more conductive bars 110 may be further formed in the encapsulant layer 112 and on the conductive pattern 108 to interconnect the conductive pattern 108 with the shielding layer 114. The conductive bar 110 can be made of copper, aluminum, silver or other suitable metal materials. In some embodiments, the conductive bar 110 may be formed prior to the encapsulant layer 112 and thus it can be fully covered by the later-formed encapsulant layer 112. In some embodiments, the conductive bar 110 may have a height substantially equal to a thickness of the encapsulant layer 112, and thus the conductive bar 110 may be exposed from a top surface of the encapsulant layer 112. For example, excess encapsulant material may be deposited on the substrate to form the encapsulant layer 112, and then be removed by planarizing the encapsulant layer 112 till the conductive bar 110. In some other embodiments such as the embodiment shown in FIG. 1A, the conductive bar 110 may have a height smaller than the thickness of the encapsulant layer 112, and accordingly a trench 116 may be formed above the conductive bar 110 and in the encapsulant layer 112, to expose a top surface of the conductive bar 110 from the encapsulant layer 112. The trench 116 may be formed by laser ablation or any other suitable process.

As shown in FIG. 1B, the trench 116 may be formed prior to the shielding layer 114. Accordingly, the shielding layer 114 may not only cover the top surface of the encapsulant layer 112 but also fill in the trench 116 to form a conformal profile. The trench 116 separates the encapsulant layer 112 into a main portion 112*a* and a peripheral portion 112*b*. In particular, the main portion 112*a* of the encapsulant layer 112 generally covers the electronic component 104, and the peripheral portion 112*b* of the encapsulant layer 112 is adjacent to the second region 102*b* of the substrate 102 and the electronic component 106 mounted thereon. In the embodiment, the peripheral portion 112*b* is formed with a ridge 120. A top surface of the ridge 120 is above the conductive bar 110, to cover the lateral side of the conductive bar 110. Depending on the location of the trench 116, the top surface of the ridge 120 may be at the same level as the top surface of the main portion 112*a* of the encapsulant layer 112 (as shown in FIG. 1B), or may be lower than the top surface of the main portion 112*a* of the encapsulant layer 112. In the embodiment shown in FIG. 1B, the peripheral portion 112*b* of the encapsulant layer 112 may have a sloping sidewall 118, which is beneficial for the deposition of the shielding layer 114, as will be elaborated below in more details. However, in some other embodiments, the peripheral portion 112*b* of the encapsulant layer 112 may have a generally vertical sidewall. The shielding layer 114 filled within the trench 116 may cover at least a portion of the top surface of the conductive bar 110 to ensure electrical connection therewith. For example, the shielding layer 114 may cover the entire top surface of the conductive bar 110 and extend further over the ridge 120, and optionally, cover a portion or an entirety of the sloping sidewall 118. In some embodiments, the shielding layer 114 may not cover the entire top surface of the conductive bar 110 and thus may not cover the ridge 120.

It can be seen that, since the conductive bar 110 is formed within the encapsulant layer 112 instead of outside of the encapsulant layer 112, the distance from the shielding layer 114 on the encapsulant layer 112 to the electronic component 106 can be reduced. In this way, either the integration of the entire semiconductor device 100 can be improved, or the size of the semiconductor device 100 can be reduced.

Figure 1C:
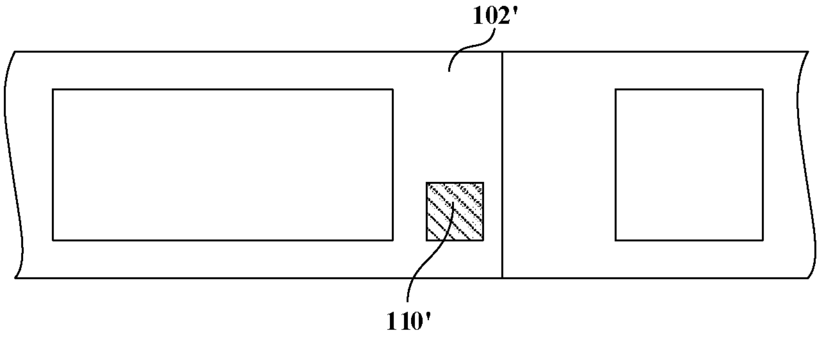
FIGS. 1C and 1D illustrate two other semiconductor devices according to embodiments of the present application.
Figure 1D:
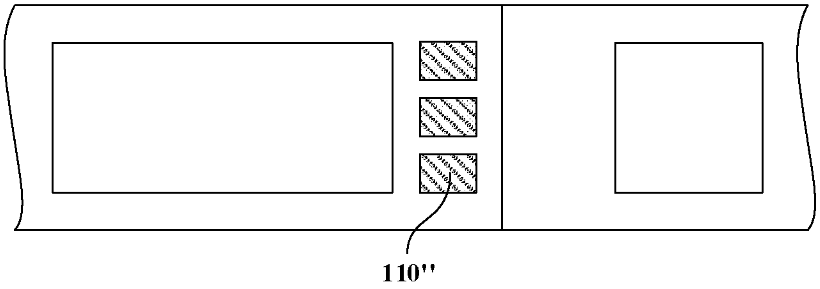

In the embodiment shown in FIG. 1A, the conductive bar 110 inside the encapsulant layer 112 is a single conductive bar with a width substantially equal to that of the semiconductor component 104. In some other embodiments, the conductive bar 110 may have alternative forms or patterns. FIGS. 1C and 1D illustrate two other semiconductor devices according to embodiments of the present application. As shown in FIG. 1C, a conductive bar 110' may have a smaller width than the conductive bar 110 shown in FIG. 1A, and thus it may occupy a smaller footprint on the substrate 102'. Furthermore, as shown in FIG. 1D, a conductive bar 110" may be formed as multiple separated conductive bars, all of which can be covered by and connected with a shielding layer (not shown).

FIGS. 2A to 2G illustrate cross-sectional views of a process for making a semiconductor device according to an embodiment of the present application. For example, the process can be used to make the semiconductor device 100 shown in FIGS. 1A and 1B.

Figure 2A:
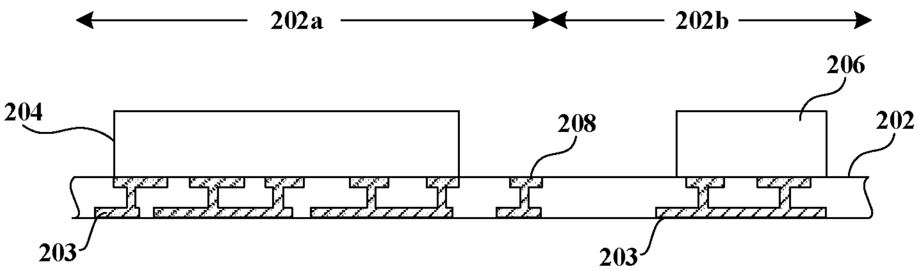
FIGS. 2A to 2G illustrate cross-sectional views of a process for making a semiconductor device according to an embodiment of the present application.

As shown in FIG. 2A, a substrate 202 is provided. The substrate 202 may include one or more insulating or passivation layers and one or more interconnection structures 203 formed in the insulating or passivation layers. The substrate 202 includes a first region 202*a* and a second region 202*b* which is adjacent to the first region 202*a*. In the following processes, the first region 202*a* will be deposited with a shielding layer (not shown), while the second region 202*b* will not be deposited with such shielding layer. However, during the design of the semiconductor device, a layout of such shielding layer and the first and second regions of the substrate 202 may be determined in advance. At least one electronic component 204 which requires EMI shielding may be disposed in the first region 202*a*, and at least one another electronic component 206 which does not require EMI shielding may be formed in the second region 202*b*. Furthermore, a conductive pattern 208 such as a contact pad is formed in the first region 202*a*, close to the first electronic component 204. The conductive pattern 208 may be formed along with the interconnection structures 203 within the substrate 202, or after the formation of the interconnection structures 203 using a metal deposition and patterning process.

Figure 2B:
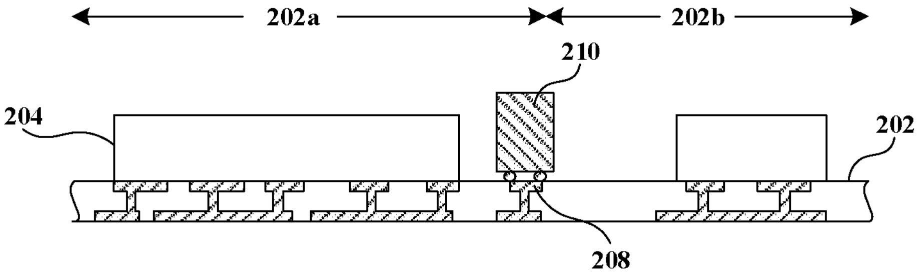

Next, as shown in FIG. 2B, a conductive bar 210 is formed on the conductive pattern 208 to elevate the conductive surface of the conductive pattern 208 higher than a top surface of the electronic component 204. In some alternative embodiments, the height of the conductive bar 210 can be smaller than or equal to that of the electronic component 204. For example, the conductive bar 210 can be a preformed metal pillar or similar structures, which can be welded or bonded onto the conductive pattern 208 formed on the substrate 202. Alternatively, the conductive bar 210 can be deposited on the substrate 202 using a lift-off process or other appropriate metal deposition and patterning processes. The conductive bar 210 can be made of copper, aluminum, silver or other suitable metal materials.

Figure 2C:
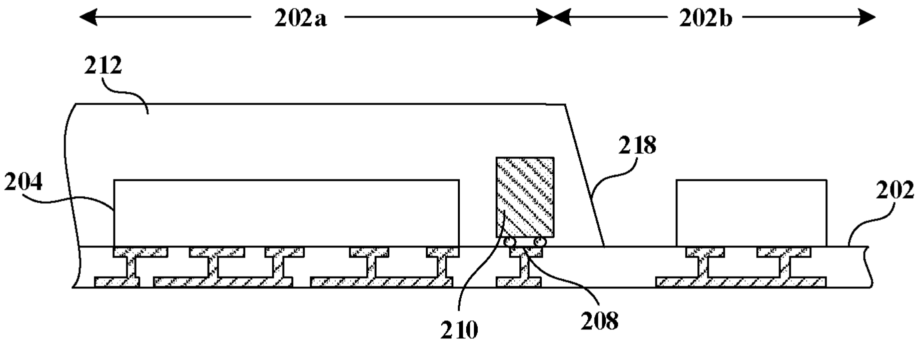

As shown in FIG. 2C, an encapsulant layer 212 may be formed in the first region 202*a* of the substrate 202, which covers the electronic component 204, the conductive bar 210 and thus the conductive pattern 208 under the conductive bar 210. The encapsulant layer 212 may be made of a general molding compound resin, for example, an epoxy-based resin, but the scope of this application is not limited thereto. The encapsulant layer 212 can protect the electronic component 204 from external circumstances. In some embodiments, a grinding operation can be performed on the encapsulant layer 204 to reduce a thickness of the encapsulant layer 204 and, optionally, to expose the electronic component 204 and/or the conductive bar 208. Furthermore, the encapsulant layer 212 has a sloping sidewall 218 close to a border between the first and second regions, and optionally at least partially inside the second region 202*b*.

Figure 2D:
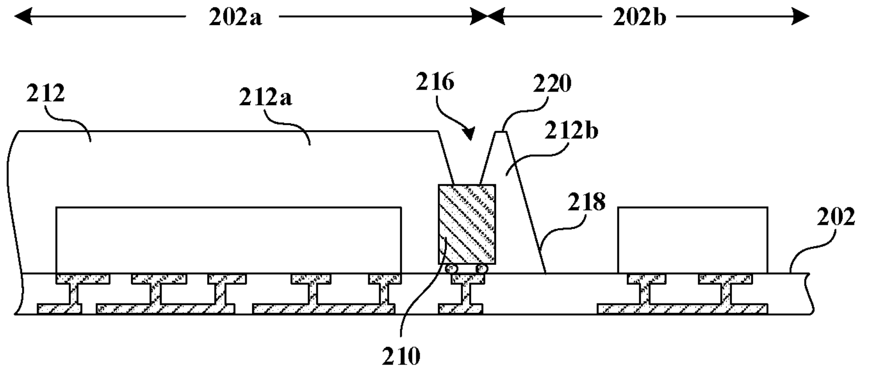

Afterwards, as shown in FIG. 2D, a portion of the encapsulant layer 212 which is above the conductive bar 208 can be removed, to expose the conductive bar 210 from the encapsulant layer 212. The exposed conductive bar 208 separates the encapsulant layer 212 into two portions, i.e., a main portion 212*a* and a peripheral portion 212*b*. The peripheral portion 212*b* is adjacent to the second region 202*b* of the substrate 202 relative to the main portion 212*a*. In the embodiment, a trench 216 may be formed using laser ablation or other suitable etching process. In some preferred embodiments, the trench 216 may extend along the conductive bar 210 to expose all or most of the top surface of the conductive bar 210. Furthermore, the peripheral portion 212*b* has a ridge 220 which is topmost of the peripheral portion 212*b*.

Figure 2E:
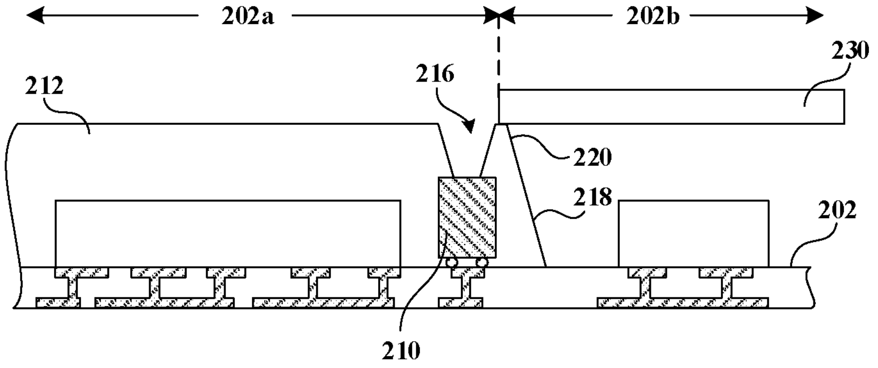

As shown in FIG. 2E, a deposition mask 230 is disposed above the substrate 202 to cover the second region 202*b*. In the embodiment, the deposition mask 230 can be in contact with the ridge 220 to form a substantially enclosed chamber above the second region 202*b*. The ridge 220 also serves as a support for the deposition mask 230. The position of the deposition mask 230 depends on a shielding layer (not shown) to be formed on the substrate 202. In some other embodiments, the deposition mask 230 may partially overhang above the trench 216 and cover a portion of the top surface of the conductive bar 210. Alternatively, the deposition mask 230 may be disposed slightly away from the trench 226 and not in contact with the ridge 220, that is, an edge of the deposition mask 230 may be right above the sloping sidewall 218 of the encapsulant layer 212.

Figure 2F:
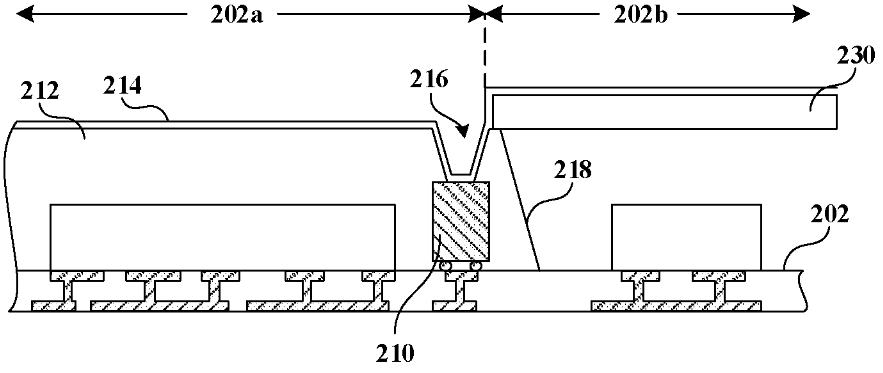

After the deposition mask 230 is in place, a deposition process may be performed as shown in FIG. 2F. In particular, a conductive material such as Al, Cu, Sn, Ni, Au, Ag, etc. may be deposited onto the substrate 202 to form a shielding layer 214. Due to the existence of the deposition mask 230, the conductive material deposited towards the second region 202*b* may be deposited on the deposition mask 230, rather than into the enclosed chamber under the deposition mask 230 and onto the second region 202*b* of the substrate 202. In some embodiments, a sputtering process, or other similar chemical or physical vapor deposition process can be used to form the shielding layer 214. In the embodiment shown in FIG. 2F, the conductive material may fill in the trench 216 and be deposited on the top surface of the conductive bar 210.

Figure 2G:
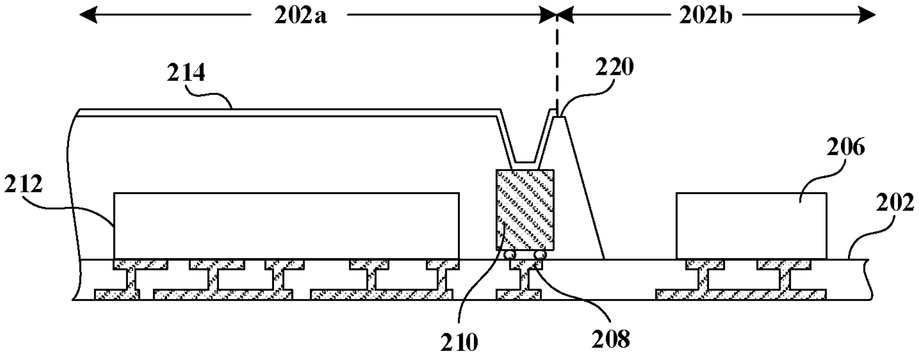

Next, as shown in FIG. 2G, the deposition mask can be removed from the substrate 202. As such, the shielding layer 214 may be selectively formed on the substrate 202, i.e., formed in the first region 202*a* but not formed in the second region 202*b* of the substrate 202. In the embodiment, the shielding layer 214 terminates at the ridge 220 where the edge of the deposition mask was supported, which is far away from the electronic component 206 mounted in the second region 202*b*. Therefore, even if some metal burrs or the like are generated at the edge of the shielding layer 214, they will not induce significant defects (e.g., short-circuit issue at the contact pads of the electronic component 206) for the semiconductor device made using the above process.

Figure 3A:
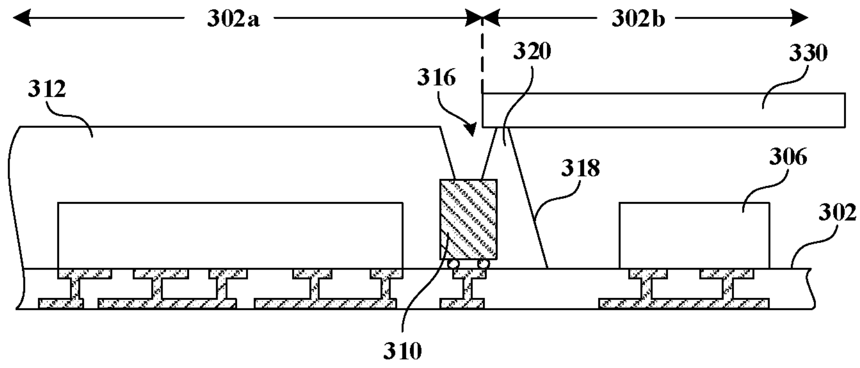
FIGS. 3A to 3C illustrate cross-sectional views of a process for making a semiconductor device according to an embodiment of the present application.
Figure 3B:
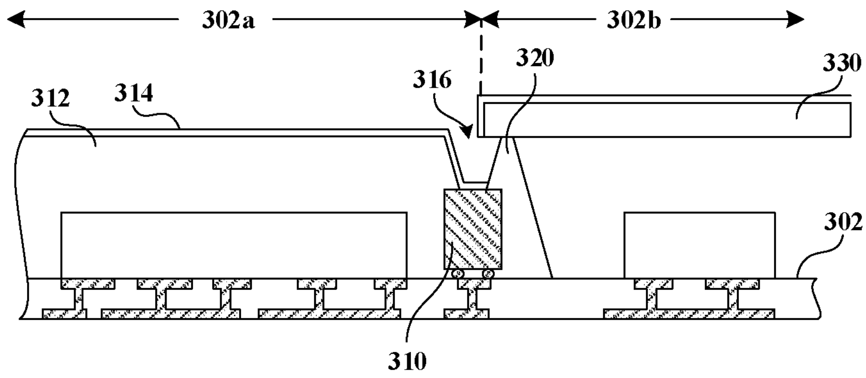
Figure 3C:
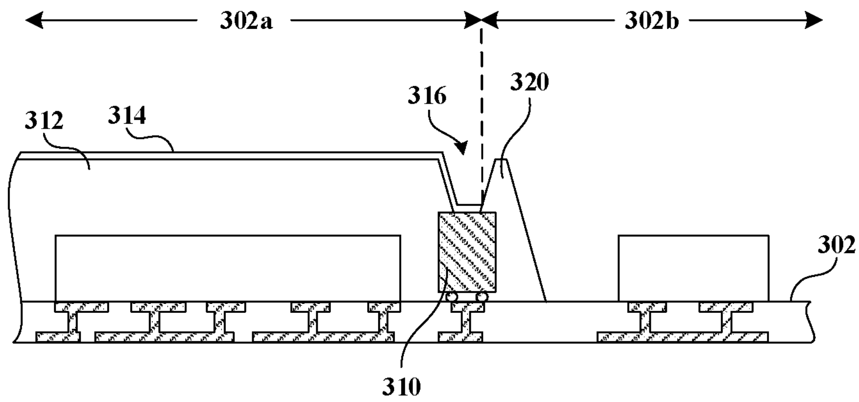

FIGS. 3A to 3C illustrate cross-sectional views of a process for making a semiconductor device according to an embodiment of the present application. The process may be performed to form the partial shielding layer on the substrate of a semiconductor device, i.e., may be performed after the encapsulation process as shown in FIG. 2D.

As shown in FIG. 3A, a deposition mask 330 is disposed above a substrate 302 to cover a second region 302*b* of the substrate 302. In the embodiment, the deposition mask 330 is in contact with a ridge 320 of an encapsulation layer 312. Furthermore, the deposition mask 330 overhangs above a trench 316 in the encapsulant layer 312 and covers a portion of the top surface of a conductive bar 310.

After the deposition mask 330 is in place, a deposition process may be performed as shown in FIG. 3B. In particular, a conductive material such as Al, Cu, Sn, Ni, Au, Ag, etc. may be deposited onto the substrate 302 to form a shielding layer 314. Due to the existence of the deposition mask 330, the conductive material deposited towards the second region 302*b* may be deposited on the deposition mask 330, rather than into the enclosed chamber under the deposition mask 330. Also, the overhanging portion of the deposition mask 330 creates a cavity under the overhanging portion, leaving an opening facing towards a sidewall of the trench 316. Furthermore, due to the overhanging portion of the deposition mask 330, the amount of conductive material deposited within the trench 316 is significantly reduced. Therefore, the shielding layer 314 formed on the encapsulant layer 312 may not be a continuous layer but breaks at the cavity under the overhanging portion of the deposition mask 330. It can be readily appreciated that the size of the cavity formed under the overhanging portion can be adjusted, depending on the desired size of the shielding layer 314 on the top surface of the conductive bar 310, the anisotropic characteristics of the shielding deposition process, and etc. In some embodiments, the cavity is configured that the shielding layer 314 formed on the encapsulant layer 312 may not cover an entire inner surface of the trench 316. For example, the shielding layer 314 may cover the top surface of the conductive bar 310 but does not fully cover the inner sidewall of the ridge 320 that is facing towards the trench 316.

As shown in FIG. 3C, after the shielding layer 314 is formed, the deposition mask can be removed from the substrate 302. By removing the deposition mask, the portion of the shielding layer formed on the deposition mask can be removed. As such, the shielding layer 314 may be selectively formed on the substrate 302, i.e., formed in the first region 302*a* but not formed in the second region 302*b* of the substrate 302. Since the portion of the shielding layer 314 formed in the trench 316 is not connected with the other portion of the shielding layer which was formed on the deposition mask due to the overhanging portion of the deposition mask, removing the deposition mask as well as the portion of the shielding layer formed thereon may not cause the shielding layer 314 to unevenly break and therefore no metal burr is generated.

Figure 4A:
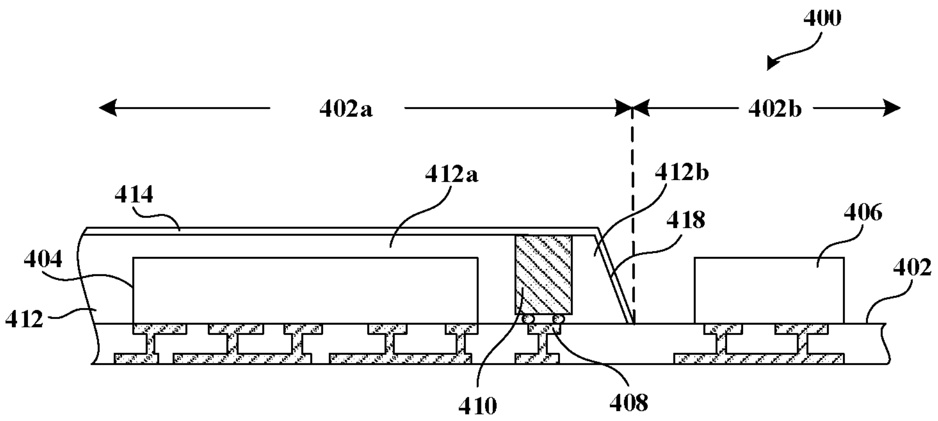
FIGS. 4A and 4B illustrate two semiconductor devices according to embodiments of the present application.
Figure 4B:
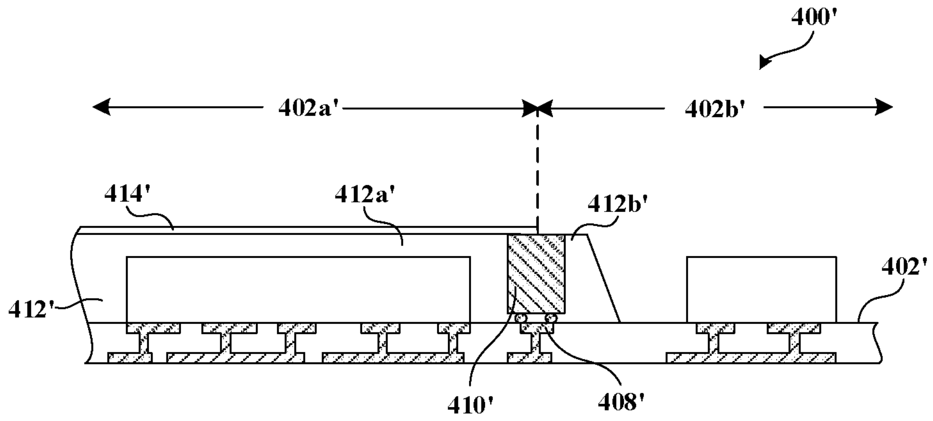

FIGS. 4A and 4B illustrate two semiconductor devices according to embodiments of the present application.

As shown in FIG. 4A, a semiconductor device 400 has a substrate 402. An encapsulant layer 412 is formed on the substrate 402 to encapsulate at least one electronic component 404, a conductive bar 410 and a conductive pattern 408 under the conductive bar 410. Another electronic components such as one or more board-to-board connectors may also be mounted on the substrate 402 but not encapsulated by the encapsulant layer 412. The encapsulant layer 412 has a thickness that is substantially equal to that of the conductive bar 410, and thus a top surface of the conductive bar 410 can be exposed from the encapsulant layer 412. The exposed conductive bar 410 separates the encapsulant layer 412 into a main portion 412*a* and a peripheral portion 412*b*.

Furthermore, a shielding layer 414 is formed on the substrate 402, covering the encapsulant layer 412 and the exposed conductive bar 410 within the encapsulant layer 412. In particular, the shielding layer 414 extends above the entire surface of the encapsulant layer 412, including a sloping sidewall 418 of the peripheral portion 412*b*.

As shown FIG. 4B, another semiconductor device 400' has a similar structure as the semiconductor device 400 shown in FIG. 4A, except that a shielding layer 414' of the semiconductor device 400' is of a smaller size. The shielding layer 414' extends from a main portion 412*a*' of an encapsulant layer 412' to a conductive bar 410', but does not pass the top surface of the conductive bar 410' and thus does not cover a peripheral portion 412*b*' of the encapsulant layer 412'. However, since the shielding layer 414' is still connected with the conductive bar 410', the shielding layer 414' can be grounded or coupled to other desired voltage reference through the conductive bar 410' and the conductive pattern 408' thereunder.

FIGS. 5A to 5E illustrate cross-sectional views of a process for making a semiconductor device according to an embodiment of the present application. The process can be used to make the semiconductor devices 400 and 400' shown in FIGS. 4A and 4B, for example.

Figure 5A:
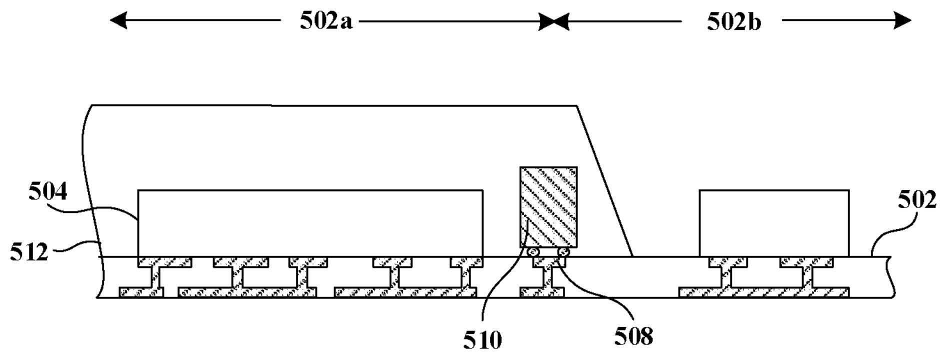
FIGS. 5A to 5E illustrate cross-sectional views of a process for making a semiconductor device according to an embodiment of the present application.

As shown in FIG. 5A, an encapsulant layer 512 may be formed in a first region 502*a* of a substrate 502, which covers an electronic component 504, a conductive bar 510 and thus a conductive pattern 508 under the conductive bar 510. Furthermore, the conductive bar 510 has a thickness or height greater than the thickness of the electronic component 504.

Figure 5B:
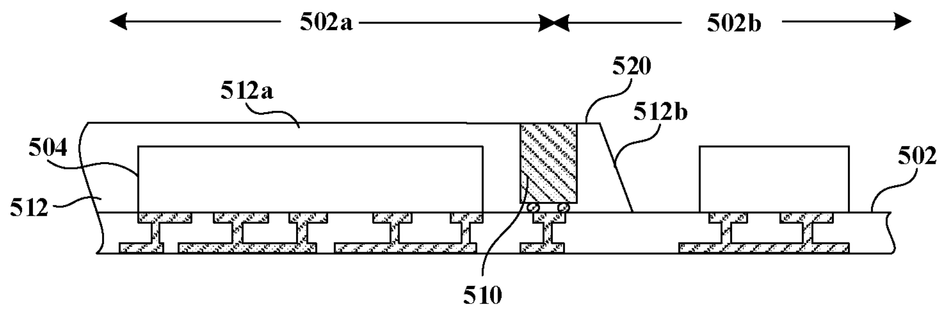

As shown in FIG. 5B, a grinding operation can be performed on the encapsulant layer 512 to planarize the encapsulant layer 512 and reduce the thickness of the encapsulant layer 512. The grinding operation may stop till the conductive bar 510 is exposed from the encapsulant layer 504. Since the electronic component 504 has a smaller thickness than the conductive bar 510, the electronic component 504 may not be exposed and thus can still be protected by the remaining encapsulant layer 512. The exposed conductive bar 510 separates the encapsulant layer 512 into two portions, i.e., a main portion 512*a* and a peripheral portion 512*b*. The peripheral portion 512*b* is adjacent to a second region 502*b* of the substrate 502 relative to the main portion 512*a*. Still, the peripheral portion 512*b* has a ridge 520 which is topmost of the peripheral portion 512*b* and aligned with the conductive bar 510 in a horizontal direction.

Figure 5C:
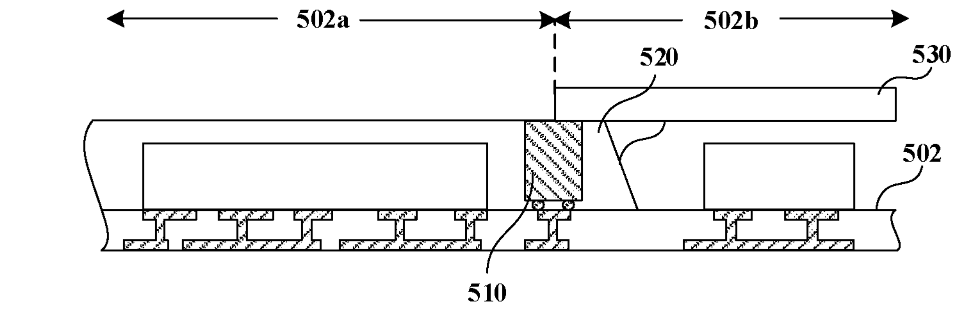

As shown in FIG. 5C, a deposition mask 530 is disposed above the substrate 502 to cover the second region 502*b*. In the embodiment, the deposition mask 530 can be in contact with the ridge 520 and a portion of the top surface of the conductive bar 510, to form a substantially enclosed chamber above the second region 502*b*. The ridge 520 and the conductive bar 510 also serve as a support for the deposition mask 530.

Figure 5D:
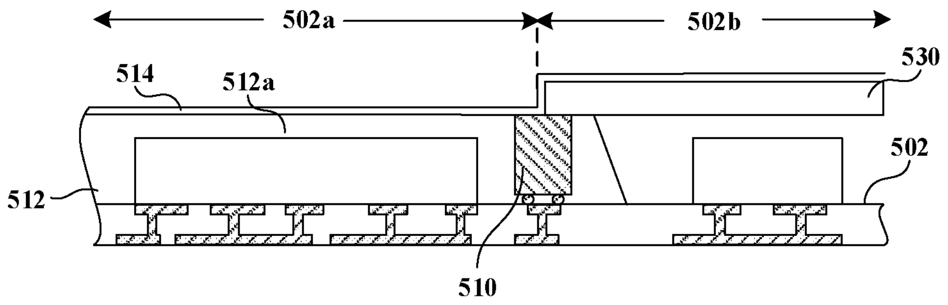

After the deposition mask 530 is in place, a deposition process may be performed as shown in FIG. 5D. In particular, a conductive material such as Al, Cu, Sn, Ni, Au, Ag, etc. may be deposited onto the substrate 502 to form a shielding layer 514 on the main portion 512*a* of the encapsulant layer 512 and the uncovered portion of the conductive bar 510. Due to the existence of the deposition mask 530, the conductive material deposited towards the second region 502*b* may be deposited on the deposition mask 530, rather than into the enclosed chamber under the deposition mask 530.

Figure 5E:
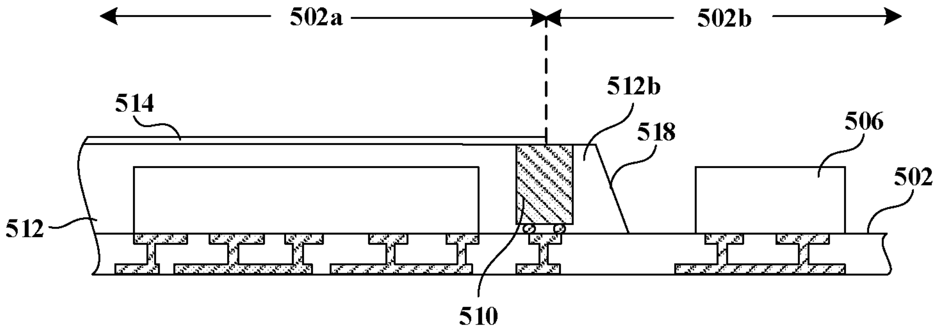

Next, as shown in FIG. 5E, the deposition mask can be removed from the substrate 502. As such, the shielding layer 514 may be selectively formed on the substrate 502, i.e., formed in the first region 502*a* but not formed in the second region 502*b* of the substrate 502. In the embodiment, the shielding layer 514 terminates at the conductive bar 510 where the edge of the deposition mask was supported, which is far away from the electronic component 506 mounted in the second region 502*b* of the substrate 502. It can be appreciated that, if the edge of the deposition mask is closer to the electronic component 506, e.g., aligned with a sidewall 518 of the lateral portion 512*b* of the encapsulation layer 512 in a vertical direction, the shielding layer 512 may be extend further towards the electronic component 506, such as the shielding layer 414 shown in FIG. 4A.

Figure 6A:
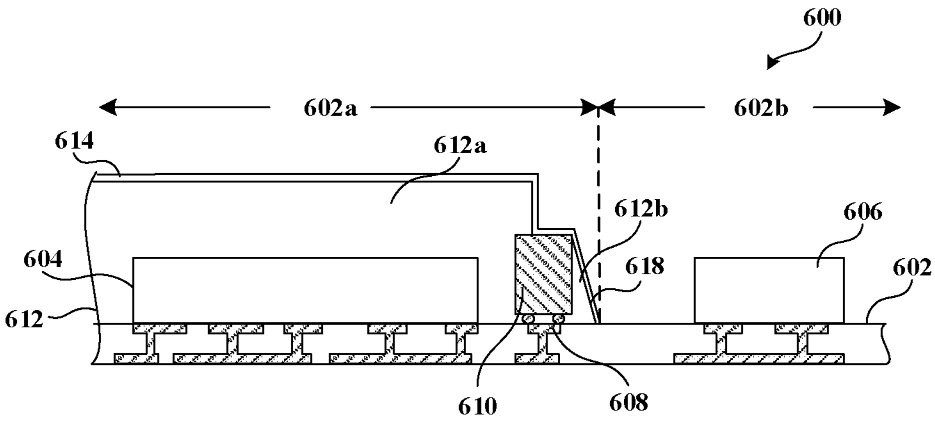
FIGS. 6A and 6B illustrate two semiconductor devices according to embodiments of the present application.
Figure 6B:
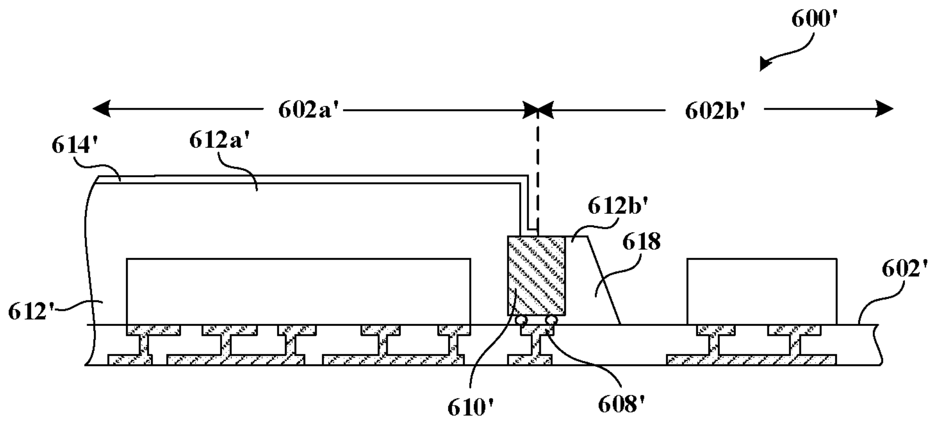

FIGS. 6A and 6B illustrate two semiconductor devices according to embodiments of the present application. Different from the semiconductors device 100 shown in FIGS. 1A and 1B, the semiconductor devices have a contact bar much closer to a sidewall of an encapsulant layer.

As shown in FIG. 6A, a semiconductor device 600 has a substrate 602. An encapsulant layer 612 is formed on the substrate 602 to encapsulate at least one electronic component 604, a conductive bar 610 and a conductive pattern 608 under the conductive bar 610. Another electronic components such as a board-to-board connector may also be mounted on the substrate 602 but not encapsulated by the encapsulant layer 612. The encapsulant layer 612 has a thickness greater than that of the conductive bar 610. However, since the conductive bar 610 is closer to a sidewall 618 of the encapsulant layer 612, a top surface of the conductive bar 610 can be exposed from the encapsulant layer 612 after a portion of the sidewall 618 is removed by laser ablation, for example. The exposed conductive bar 610 separates the encapsulant layer 612 into a main portion 612*a* and a peripheral portion 612*b*.

Furthermore, a shielding layer 614 is formed on the substrate 602, covering the encapsulant layer 612 and the exposed conductive bar 610 within the encapsulant layer 612. In particular, the shielding layer 614 extends above the entire surface of the encapsulant layer 612, including the sloping sidewall 618 of the peripheral portion 612*b*.

As shown FIG. 6B, another semiconductor device 600' has a similar structure as the semiconductor device 600 shown in FIG. 6A, except that a shielding layer 614' of the semiconductor device 600' is of a smaller size. The shielding layer 614' extends from a main portion 612*a*' of an encapsulant layer 612' to a conductive bar 610', but does not pass the top surface of the conductive bar 610' and thus does not cover a peripheral portion 612*b*' of the encapsulant layer 612'. However, since the shielding layer 614' is still connected with the conductive bar 610', the shielding layer 614' can be grounded or coupled to other desired voltage reference through the conductive bar 610' and the conductive pattern 608' thereunder.

FIGS. 7A to 7D illustrate cross-sectional views of a process for making a semiconductor device according to an embodiment of the present application. The process can be used to make the semiconductor devices 600 and 600' shown in FIGS. 6A and 6B, for example.

Figure 7A:
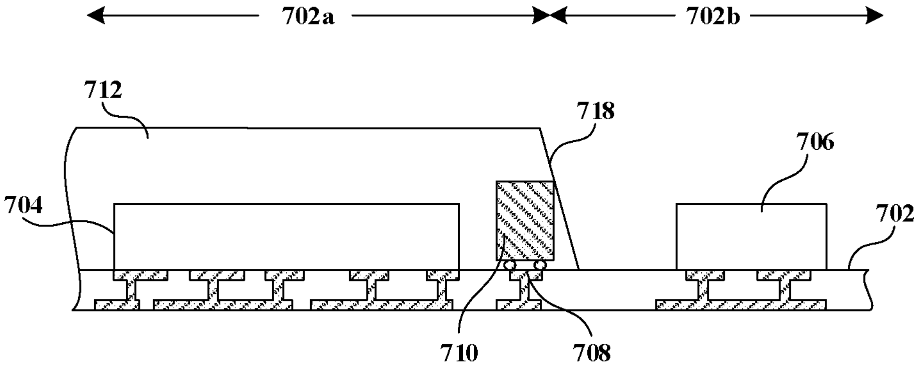
FIGS. 7A to 7D illustrate cross-sectional views of a process for making a semiconductor device according to an embodiment of the present application.

As shown in FIG. 7A, an encapsulant layer 712 may be formed in a first region 702*a* of a substrate 702, which covers an electronic component 704, a conductive bar 710 and thus a conductive pattern 708 under the conductive bar 710. Furthermore, the conductive bar 710 has a thickness or height greater than the thickness of the electronic component 704. The encapsulant layer 712 has a sloping sidewall 718 towards an electronic component 706 mounted in a second region 702*b* of the substrate 702, and the conductive bar 710 is close to the sloping sidewall 718, or particularly, at least a portion of the conductive bar 710 is under the sloping sidewall 718.

Figure 7B:
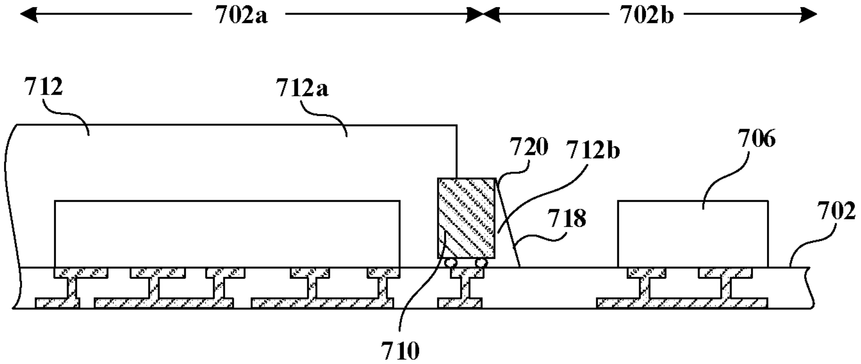

As shown in FIG. 7B, at least a portion of the encapsulant layer 712 which is above the conductive bar 710 may be removed, for example, using laser ablation. It can be seen that, a portion of the sidewall 718 may be removed as well. In this way, a top surface of the conductive bar 710 can be exposed from the encapsulant layer 712. The exposed conductive bar 710 separates the encapsulant layer 712 into two portions, i.e., a main portion 712*a* and a peripheral portion 712*b*. The peripheral portion 712*b* is adjacent to the second region 702*b* of the substrate 702 relative to the main portion 712*a*. Still, the peripheral portion 712*b* has a ridge 720 which is topmost of the peripheral portion 712*b* and aligned with the conductive bar 710 in a horizontal direction.

Figure 7C:
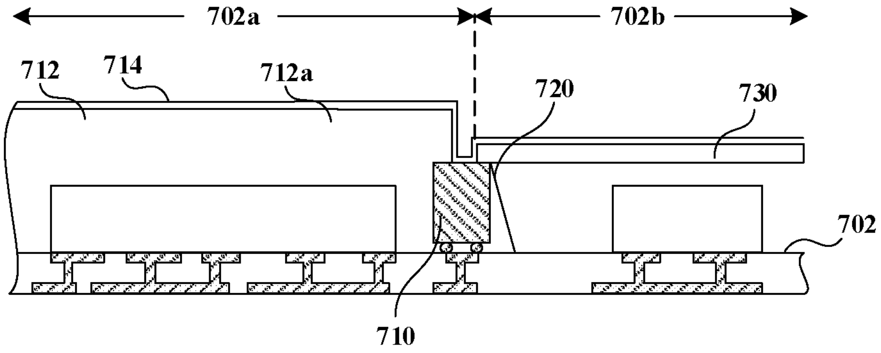

As shown in FIG. 7C, a deposition mask 730 is disposed above the substrate 702 to cover the second region 702*b*. In the embodiment, the deposition mask 730 can be in contact with the ridge 720 and a portion of the top surface of the conductive bar 710, to form a substantially enclosed chamber above the second region 702*b*. The ridge 720 and the conductive bar 710 also serve as a support for the deposition mask 730. After the deposition mask 730 is in place, a deposition process may be performed to form a shielding layer 714 on the main portion 712*a* of the encapsulant layer 712 and the uncovered portion of the conductive bar 710. Due to the existence of the deposition mask 730, the conductive material deposited towards the second region 702*b* may be deposited on the deposition mask 730, rather than into the enclosed chamber under the deposition mask 730.

Figure 7D:
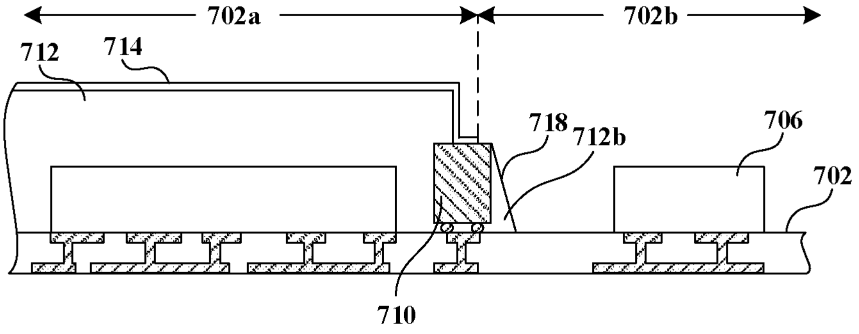

Next, as shown in FIG. 7D, the deposition mask can be removed from the substrate 702. In the embodiment, the shielding layer 714 terminates at the conductive bar 710 where the edge of the deposition mask was supported, which is far away from the electronic component 706 mounted in the second region 702*b* of the substrate 702. It can be appreciated that, if the edge of the deposition mask is closer to the electronic component 706, e.g., aligned with the bottom of the sloping sidewall 718 of the lateral portion 712*b* in a vertical direction, the shielding layer 712 may be extend further towards the electronic component 706, such as the shielding layer 614 shown in FIG. 6A.

The discussion herein included numerous illustrative figures that showed various portions of a partially shielded semiconductor device and a method for making such semiconductor device. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making a semiconductor device, comprising:

providing a substrate having a first region and a second region, wherein the first region comprises at least one electronic component and a conductive pattern formed therein;

forming a conductive bar on the conductive pattern;

forming an encapsulant layer in the first region of the substrate to cover the at least one electronic component, the conductive bar and the conductive pattern;

removing a portion of the encapsulant layer that is above the conductive bar to expose the conductive bar and separate the encapsulant layer into a main portion and a peripheral portion, wherein the peripheral portion is adjacent to the second region of the substrate relative to the main portion;

disposing a deposition mask above the substrate to cover the second region; and depositing a conductive material on the substrate to form a shielding layer on the substrate which is not covered by the deposition mask.

2. The method of claim 1, wherein the peripheral portion of the encapsulant layer comprises a sloping sidewall.

3. The method of claim 1, wherein removing a portion of the encapsulant layer that is above the conductive bar comprises:

forming a trench in the encapsulant layer above the conductive bar.

4. The method of claim 1, wherein removing a portion of the encapsulant layer that is above the conductive bar comprise:

planarizing the encapsulant layer till the conductive bar.

5. The method of claim 1, wherein the peripheral portion of the encapsulant layer comprises a sloping sidewall which is partially above the conductive bar, and wherein removing a portion of the encapsulant layer that is above the conductive bar comprise:

removing the portion of the sloping sidewall that is above the conductive bar.

6. The method of claim 1, wherein disposing a deposition mask above the substrate to at least cover the second region comprises:

disposing the deposition mask above the second region and at least partially above the peripheral portion.

7. The method of claim 1, wherein disposing a deposition mask above the substrate to at least cover the second region comprises:

disposing the deposition mask above the second region and the peripheral portion and partially above the conductive bar.

8. The method of claim 1, wherein disposing a deposition mask above the substrate to at least cover the second region comprises:

placing an edge of the deposition mask on the peripheral portion.

9. The method of claim 1, wherein disposing a deposition mask above the substrate to at least cover the second region comprises:

placing an edge of the deposition mask on the conductive bar.

10. The method of claim 1, wherein removing a portion of the encapsulant layer that is above the conductive bar comprises:

forming a trench in the encapsulant layer above the conductive bar;

and wherein disposing a deposition mask above the substrate to at least cover the second region comprises:

overhanging the deposition mask above the trench and exposing a portion of the conductive bar.

11. The method of claim 10, wherein overhanging the deposition mask above the trench and exposing a portion of the conductive bar comprises:

placing an edge of the deposition mask above the conductive bar.

12. The method of claim 1, wherein the second region comprises at least one another electronic component.

13. A partially shielded semiconductor device, comprising:

a substrate having a first region and a second region adjacent to the first region, wherein a first electronic component is disposed within the first region and a second electronic component is disposed within the second region;

an encapsulant layer formed on the substrate and covering the first electronic component;

a shielding layer formed on the encapsulant layer in the first region but not in the second region;

a conductive pattern formed on the substrate and within the encapsulant layer; and a conductive bar formed within the encapsulant layer and exposed from the encapsulant layer, wherein at least a portion of the conductive bar is shielded by and connected with the shielding layer to electrically coupling the shielding layer with the conductive pattern on the substrate.

14. The partially shielded semiconductor device of claim 13, wherein the encapsulant layer comprises a trench above the conductive bar to expose the conductive bar from the encapsulant layer.

15. The partially shielded semiconductor device of claim 13, wherein the shielding layer is deposited within the trench but does not cover an entire inner surface of the trench.

* * * * *